US012690308B2

(12) United States Patent
Suich et al.

(10) Patent No.: US 12,690,308 B2
(45) Date of Patent: Jul. 21, 2026

(54) IDENTIFICATION MARKERS FOR LIGHT-EMITTING DIODES AND RELATED METHODS

(71) Applicant: CreeLED, Inc., Durham, NC (US)

(72) Inventors: David Suich, Durham, NC (US); Colin Blakely, Raleigh, NC (US); Michael Check, Holly Springs, NC (US); Joseph G. Sokol, Durham, NC (US); Andre Pertuit, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 0 days.

(21) Appl. No.: 18/933,131

(22) Filed: Oct. 31, 2024

(65) Prior Publication Data

US 2026/0123116 A1     Apr. 30, 2026

(51) Int. Cl.
*H10H 20/851* (2025.01)
*G06K 7/14* (2006.01)

(52) U.S. Cl.
CPC ....... *H10H 20/8514* (2025.01); *G06K 7/1413* (2013.01); *G06K 7/1417* (2013.01)

(58) Field of Classification Search
CPC . H10H 20/8514; G06K 7/1413; G06K 7/1417
See application file for complete search history.

(56) References Cited

U.S. PATENT DOCUMENTS

| | | | |
|---|---|---|---|
| 12,051,769 B2 | 7/2024 | Blakely et al. | |
| 2020/0176507 A1 | 6/2020 | Hall et al. | |
| 2023/0290908 A1 | 9/2023 | Pust et al. | |
| 2023/0390472 A1* | 12/2023 | Beavers ................. | A61M 1/80 |

FOREIGN PATENT DOCUMENTS

| | | |
|---|---|---|
| JP | 5223726 B2 | 6/2013 |
| KR | 20130068497 A | 6/2013 |

OTHER PUBLICATIONS

International Search Report and Written Opinion for International Patent Application No. PCT/US2025/052670, mailed Feb. 18, 2026, 17 pages.

* cited by examiner

*Primary Examiner* — Matthew Mikels
(74) *Attorney, Agent, or Firm* — Withrow & Terranova, P.L.L.C.

(57) ABSTRACT

Solid-state lighting devices including light-emitting diodes (LEDs) and more particularly identification markers for LED packages and related methods are disclosed. Identification markers may include materials incorporated within LED packages that are transparent in a visible spectrum but detectable when illuminated with light outside the visible spectrum. When radiated with light outside the visible spectrum, identification markers may provide light in the visible spectrum. Alternatively, identification markers may provide light outside the visible spectrum that is detectable with equipment capable of detecting nonvisible light. Identification markers are generally configured to not be readily visible under inspection as a way to make LED packages more difficult for copying in counterfeit products.

21 Claims, 10 Drawing Sheets

IDENTIFICATION MARKERS FOR LIGHT-EMITTING DIODES AND RELATED METHODS

FIELD OF THE DISCLOSURE

The present disclosure relates to solid-state lighting devices including light-emitting diodes (LEDs) and more particularly to identification markers for LED packages.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new applications.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from gallium nitride, gallium phosphide, aluminum nitride, gallium arsenide-based materials, and/or from organic semiconductor materials. LED packages have been developed that can provide mechanical support, electrical connections, and encapsulation for LED chips with suitable emission efficiencies.

The art continues to seek improved LEDs and solid-state lighting devices having desirable operating characteristics capable of overcoming challenges associated with conventional devices.

SUMMARY

The present disclosure relates to solid-state lighting devices including light-emitting diodes (LEDs) and more particularly to identification markers for LED packages and related methods. Identification markers may include materials incorporated within LED packages that are transparent in a visible spectrum but detectable when illuminated with light outside the visible spectrum. When radiated with light outside the visible spectrum, identification markers may provide light in the visible spectrum. Alternatively, identification markers may provide light outside the visible spectrum that is detectable with equipment capable of detecting nonvisible light. Identification markers are generally configured to not be readily visible under inspection as a way to make LED packages more difficult for copying in counterfeit products.

In one aspect, an LED package comprises: at least one LED chip; a support structure comprising electrical connections electrically coupled to the at least one LED chip; and an identification marker on the support structure, the identification marker configured to be transparent to light in a first wavelength range from 400 nanometers (nm) to 700 nm. In certain embodiments, the identification marker is configured to be detectable under light in a second wavelength range that is outside the first wavelength range. In certain embodiments, the identification marker is configured to convert light in the second wavelength range to visible light in the first wavelength range. In certain embodiments, the identification marker is configured to absorb light in the second wavelength range and generate light in the second wavelength range that is detectable with a detection device capable of detecting light in the second wavelength range. In certain embodiments, the second wavelength range is from 100 nm to less than 400 nm or from above 700 nm to 2000 nm.

In certain embodiments, the support structure comprises a submount on which the at least one LED chip is mounted, and the identification marker is on the submount and laterally spaced from the at least one LED chip. The LED package may further comprise an encapsulant on the submount, wherein the encapsulant forms a lens over the at least one LED chip and the identification marker is outside a boundary of the lens. In certain embodiments, the encapsulant forms an extension that laterally extends from the boundary of the lens to a peripheral edge of the submount, and the identification marker is covered by the extension.

The LED package may further comprise a lumiphoric material on the at least one LED chip, the lumiphoric material configured to convert at least a portion of light from the at least one LED chip to another wavelength that is in the first wavelength range. In certain embodiments, the lumiphoric material is further arranged to cover the identification marker on the support structure. In certain embodiments, the lumiphoric material is between the identification marker and the support structure. In certain embodiments, the identification marker comprises a distribution of particles within the lumiphoric material.

In certain embodiments, the identification marker is on the at least one LED chip. In certain embodiments, the identification marker is between the at least one LED chip and the support structure. The LED package may further comprise a first package mounting pad and a second package mounting pad on a side of the support structure opposite the at least one LED chip, wherein the identification marker is between the first package mounting pad and the second package mounting pad. In certain embodiments, the identification marker forms at least one of alphanumeric characters, a bar code, or a quick-response code. In certain embodiments, the identification marker comprises a unique material such that the remainder of the LED package is devoid of the unique material.

In another aspect, a method of identification for a light-emitting device comprises: providing a light-emitting diode (LED) package comprising at least one LED chip configured to emit light in a first wavelength range from 400 nanometers (nm) to 700 nm and an identification marker configured to be transparent to light in the first wavelength range; and detecting the identification marker. In certain embodiments, detecting the identification marker comprises radiating the LED package with a light source, the light source providing light in a second wavelength range from 100 nm to less than 400 nm or from above 700 nm to 2000 nm. In certain embodiments, detecting the identification marker comprises destructive characterization of the LED package.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 4 is a cross-sectional view of an LED package that is similar to the LED package of FIGS. 3A to 3B with an alternative location of the identification marker relative to the lumiphoric material.

FIG. 5 is a cross-sectional view of an LED package that is similar to the LED package of FIGS. 3A to 3B with another alternative location of the identification marker relative to the lumiphoric material.

FIG. 6 is a cross-sectional view of an LED package that is similar to the LED package of FIGS. 3A to 3B with yet another alternative location of the identification marker relative to the lumiphoric material.

DETAILED DESCRIPTION

Figure 1A:
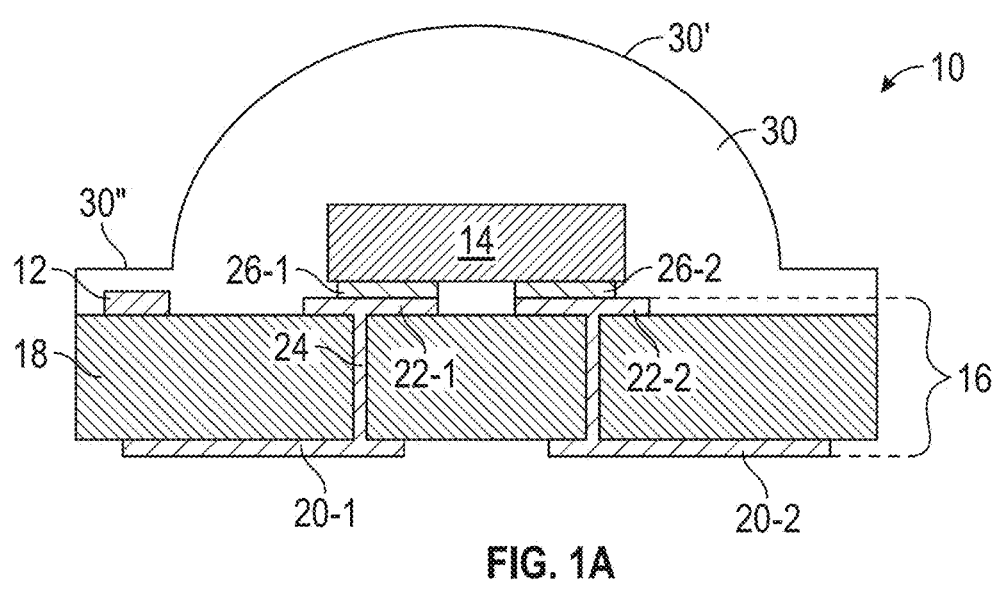
FIG. 1A is a cross-sectional view of a light-emitting diode (LED) package with an identification marker according to principles of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to solid-state lighting devices including light-emitting diodes (LEDs) and more particularly to identification markers for LED packages and related methods. Identification markers may include materials incorporated within LED packages that are transparent in a visible spectrum but detectable when illuminated with light outside the visible spectrum. When radiated with light outside the visible spectrum, identification markers may provide light in the visible spectrum. Alternatively, identification markers may provide light outside the visible spectrum that is detectable with equipment capable of detecting nonvisible light. Identification markers are generally configured to not be readily visible under inspection as a way to make LED packages more difficult for copying in counterfeit products.

Before delving into specific details for aspects of the present disclosure, an overview of various elements that may be included in exemplary LED packages is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure may comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer may comprise a single quantum well, a multiple quantum well, a double heterostructure, and/or super lattice structures.

The active LED structure may be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). Other material systems include organic semiconductor materials, and other Group III-V systems such as gallium phosphide (GaP), gallium arsenide (GaAs), and related compounds. The active LED structure may be grown on a growth substrate that can include many materials, such as sapphire, silicon carbide (SiC), silicon, aluminum nitride (AlN), and GaN.

Different embodiments of the active LED structure may emit different wavelengths of light depending on the composition of the active layer. In some embodiments, the active LED structure emits blue light with a peak wavelength range of approximately 430 nanometers (nm) to 480 nm. In other embodiments, the active LED structure emits green light with a peak wavelength range of 500 nm to 570 nm. In other embodiments, the active LED structure emits red light with a peak wavelength range of 600 nm to 700 nm.

An LED chip may also be covered with one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having a different peak wavelength than the LED source. An LED source and one or more lumiphoric materials may be selected such that their combined output results in light with one or more desired characteristics such as color, color point, intensity, etc.

Lumiphoric materials as described herein may be or include one or more of a phosphor, a scintillator, a lumiphoric ink, a quantum dot material, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip in various configurations. In certain embodiments, lumiphoric materials may be provided over one or more surfaces of LED chips, while other surfaces of such LED chips may be devoid of lumiphoric material.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side of the LED chip that is opposite a substrate, such as a growth substrate. In certain embodiments, a lateral geometry LED chip may be mounted on a submount of an LED package such that the anode and cathode connections are on a face of the LED chip that is opposite the submount. In this configuration, wire bonds may be used to provide electrical connections with the anode and cathode connections. In other embodiments, a lateral geometry LED chip may be flip-chip mounted on a surface of a submount of an LED package such that the anode and cathode connections are on a face of the active LED structure that is adjacent to the submount. In this configuration, electrical traces or patterns may be provided on the submount for providing electrical connections to the anode and cathode connections of the LED chip. In a flip-chip configuration, the active LED structure is configured between the substrate of the LED chip and the submount for the LED package. Accordingly, light emitted from the active LED structure may pass through the substrate in a desired emission direction. In other embodiments, an active LED structure may be bonded to a carrier submount, and the growth substrate may be removed such that light may exit the active LED structure without passing through the growth substrate.

According to aspects of the present disclosure, LED packages may include one or more elements, such as lumiphoric materials, encapsulants, light-altering materials, lenses, and electrical contacts, among others that are provided with one or more LED chips. In certain aspects, an LED package may include a support structure or support element, such as a submount.

Submount structures typically include submounts with electrically conductive traces. Exemplary submount materials include ceramic materials such as aluminum oxide or alumina, AlN, or organic insulators like polyimide (PI) and polyphthalamide (PPA). In certain embodiments, submounts may comprise a printed circuit board (PCB), sapphire, Si or any other suitable material. For PCB embodiments, different PCB types can be used such as standard FR-4 PCB, metal core PCB, or any other type of PCB. Aspects of the present disclosure are also well suited for embodiments with flexible substrates. By way of example, a flexible submount may comprise a polyimide, a polyethylene terephthalate (PET), and the like with electrically conductive traces. Flexible submounts allow improved bonding in a conformal manner to other surfaces that may not be entirely planar.

Encapsulant materials, such as silicone, epoxy, or polymethyl methacrylate (PMMA), among others, may be formed to encapsulate the LED chips over a submount. In certain embodiments, one or more lumiphoric materials, such as phosphor particles, may be integrated or otherwise embedded within the encapsulant material. Moreover, encapsulant materials may be shaped to form single lens structures and/or multiple lens structures in a single LED package.

Light-altering materials may be arranged within LED packages, such as along submount surfaces, to reflect or otherwise redirect light from the one or more LED chips in a desired emission direction or pattern. As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide (TiO2), or metal particles suspended in a binder, such as silicone or epoxy. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque color, such as black or gray for absorbing light and increasing contrast. In certain embodiments, the light-altering material includes both light-reflective material and light-absorbing material suspended in a binder.

Aspects of the present disclosure are applicable to both single-chip and multiple-chip LED packages. In multiple-chip LED packages, multiple LED chips are arranged within a common recess or on a common submount and sometimes beneath a common lens of an LED package. In certain multiple-chip embodiments, LED packages may include red, green, and blue LED chips such that the LED package may be positioned as a pixel in an LED display. In other embodiments, aspects of the present disclosure may be applicable to other LED packages, such as those that include one or more LED chips with a recipient lumiphoric material that converts at least a portion of light generated from the one or more LED chips to a different wavelength.

As described herein, LED packages may include complex arrangements of elements including submount structures such as submounts or lead frames, lumiphoric materials, encapsulants, light-altering materials, lenses, and electrical contacts, among others that are arranged with one or more LED chips. Counterfeit or copycat LED packages, which are typically of lower quality, are becoming more prominent in the marketplace and include arrangements of elements intended to look the same as an LED package from a reputable manufacturer. Once LED packages are incorporated into lighting devices, it can be difficult to distinguish which lighting devices include such counterfeit or copycat LED packages. This can be especially problematic when lower quality or failed LED packages are mistakenly returned to a reputable manufacturer under the belief that they originated from that manufacturer. Some LED packages include identification in the form of serialization numbers, letters and/or logos provided as a visual identifier of the manufacturer. However, counterfeit LED packages may easily copy such visual intensifiers.

According to embodiments disclosed herein, LED packages include arrangements of elements that form identification markers that are not readily viewable with visual inspection. For example, identification markers may include materials, such as inks, pigments, lumiphoric materials, chromophores, or doped glass, that are transparent in a visible spectrum from about 400 nm to about 700 nm but detectable when illuminated with light outside this visible spectrum, such as ultraviolet below about 400 nm or infrared above about 700 nm. In the example of doped glass, the glass may have a similar refractive index as an encapsulant material, such as silicone, and would appear transparent. When illuminated with light outside the visible spectrum, the dopant would provide a detectable emission signal. In certain embodiments, the identification markers are visually detectable when illuminated with nonvisible light. In other embodiments, the identification markers may only be detectable with other equipment, such as cameras and filters, capable of detecting nonvisible light. By configuring the identification markers to not be readily visible under inspection, counterfeit manufacturers may have more difficulty copying the identification markers in counterfeit products. However, the manufacturer whose LED packages are copied may readily identify counterfeit products with knowledge of the specific way to detect the identification markers.

In various embodiments, the identification markers may include one or more various types of indicators, such as at least one of a logo, one or more alphanumeric characters, or a symbol configured to convey information. The identification markers may include a company's name, or a designation of origin or source, or a trademark. In further embodiments, the identification markers may include information about the LED package, including wavelength of light, brightness, or other performance characteristics.

FIG. 1A is a cross-sectional view of an LED package 10 with an identification marker 12 according to principles of the present disclosure. The LED package includes an LED chip 14 on a support structure 16. By way of example, the support structure 16 in FIG. 1A includes a submount 18 with package mounting pads 20-1, 20-2 arranged on a bottom surface thereof for mounting the LED package 10 to another surface. In certain embodiments, the package mounting pads 20-1, 20-2 may be electrically coupled to corresponding attach pads 22-1, 22-2 of the support structure 16 by way of vias 24. The LED chip 14 is mounted on a top surface of the support structure 16 by way of bonding anode and cathode pads 26-1, 26-2 of the LED chip 14 to the corresponding attach pads 22-1, 22-2. An encapsulant 30 may cover and encapsulate the LED chip 14 on the submount 18. In certain embodiments, the encapsulant 30 may form a lens 30' configured to direct emissions exiting the LED package 10. The lens 30' may form a shape including hemispheric, ellipsoid, ellipsoid bullet, cubic, flat, hex-shaped or square. In certain embodiments, another suitable shape for the lens 30' includes both curved and planar surfaces, such as a hemispheric or curved top portion with planar side surfaces. The encapsulant 30 may further form an extension 30" that extends from the lens 30' to one or more perimeter edges of the submount 18. The extension 30" may form a generally planar portion of the encapsulant 30 that covers portions of the submount 18 outside a boundary of the lens 30'.

In FIG. 1A, the identification marker 12 is positioned on the submount 18 and laterally spaced from the LED chip 14.

As described above, the identification marker 12 is configured to be transparent to visible light in a range from 400 nm to 700 nm. In this regard, the identification marker 12 would not be readily visible to an observer when the LED chip 14 is electrically deactivated. Moreover, the identification marker 12 is also configured to be transparent to light emitted by the LED chip 14 so the identification marker 12 remains transparent when the LED chip is electrically activated. In certain embodiments, the identification marker 12 is configured to be detectable under ultraviolet light in a range from 100 nm to less than 400 nm. In other embodiments, the identification marker 12 is configured to be detectable under infrared light in a range from above 700 nm to 2000 nm. In this regard, the identification marker 12 is not readily detected unless one has knowledge of how to check for it.

As illustrated in FIG. 1A, the identification marker 12 may be positioned on the submount 18 in a position that is outside a boundary of the lens 30'. For example, the identification marker 12 may be positioned proximate to an edge and/or corner of the submount 18 and covered by the extension 30" of the encapsulant 30. Accordingly, the identification marker 12 is positioned outside the area of the LED package 10 where light paths extend from the LED chip 14 to interact with the lens 30'.

Figure 1B:
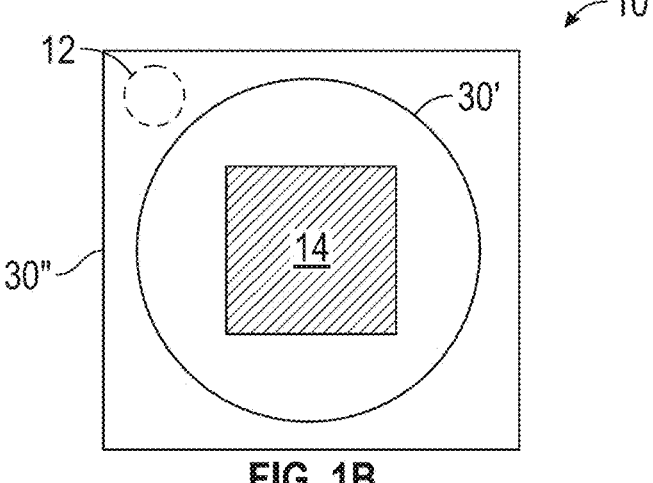
FIG. 1B is a top view of the LED package of FIG. 1A where the identification marker is not detectable under visible light and/or light emitted by the LED chip.

FIG. 1B is a top view of the LED package 10 of FIG. 1A where the identification marker 12 is not detectable under visible light and/or light emitted by the LED chip 14. The identification marker 12 is effectively invisible to an observer under normal operation of the LED package 10 and/or when the LED package 10 is electrically deactivated and under ambient visible light. Accordingly, attempts to counterfeit the LED package 10 may not include the identification marker 12. For illustrative purposes, the location of the identification marker 12 is shown in dashed line.

Figure 1C:
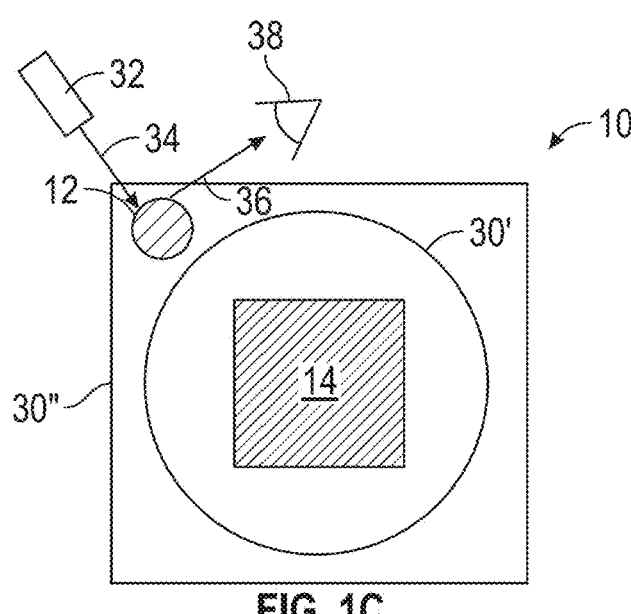
FIG. 1C is a top view of the LED package of FIG. 1B where the identification marker is visually detectable when illuminated with light outside a visible spectrum.

FIG. 1C is a top view of the LED package 10 of FIG. 1B where the identification marker 12 is visually detectable when illuminated with light outside the visible spectrum. By way of example, a light source 32 may radiate the LED package 10 with nonvisible light 34, such as in a range from 100 nm to less than 400 nm, to impinge the LED package 10. The identification marker 12 may absorb the nonvisible light 34 and generate visible light 36 (e.g., 400 nm to 700 nm). Accordingly, the visible light 36 may be readily detectable by a human eye 38 when the LED package 10 is illuminated with the nonvisible light 34. The LED package 10 is thereby configured to be readily identifiable by the manufacturer and/or customers with knowledge of the identification marker 12 and which wavelengths of nonvisible light are required to detect it.

Figures 2A, 2B, 2C:
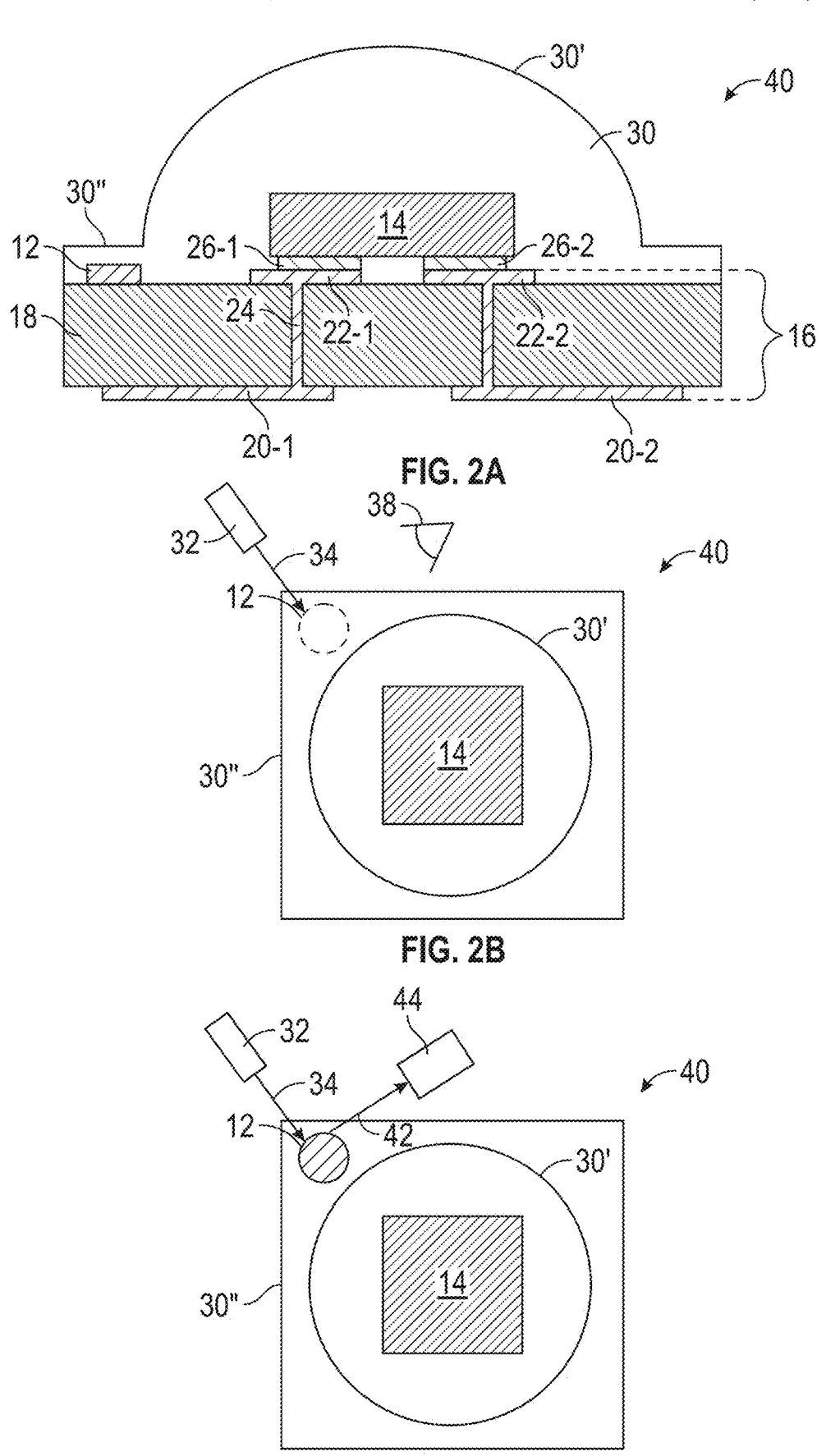
FIG. 2A is a cross-sectional view of an LED package with an alternative configuration where the identification marker remains visually undetectable to human vision when illuminated with nonvisible light and is detectable by way of a detection device capable of detecting nonvisible light.
FIG. 2B is a top view of the LED package of FIG. 2A where the identification marker is not detectable by the human eye under visible light and nonvisible light.
FIG. 2C is a top view of the LED package of FIG. 2B where the identification marker is detectable with the detection device when illuminated with nonvisible light.

FIGS. 2A to 2C are various views of an LED package 40 similar to the LED package 10 of FIGS. 1A to 1C for embodiments where the identification marker 12 remains visually undetectable to a human eye when illuminated with nonvisible light. Instead, the identification marker 12 provides nonvisible light 42 in response to being radiated with the nonvisible light 34 from the light source 32. Accordingly, a detection device 44, such as a camera or a sensor, is required that is capable of detecting the nonvisible light 42 from the identification marker 12. In certain embodiments, the nonvisible light 34 from the light source 32 and the nonvisible light 42 from the identification marker 12 may be the same wavelength or range of wavelengths. In other embodiments, the nonvisible light 34 from the light source 32 and the nonvisible light 42 from the identification marker 12 may have different wavelengths or range of wavelengths.

FIG. 2A is a cross-sectional view of the LED package 40 with the alternative configuration for the identification marker 12 according to principles of the present disclosure. The LED package 40 may essentially be structured the same as the LED package 10 of FIGS. 1A to 1C, but where the material of the identification marker 12 is changed to remain undetectable to human vision.

FIG. 2B is a top view of the LED package 40 of FIG. 2A where the identification marker 12 is not detectable by the human eye 38 under visible light, under light emitted by the LED chip 14, and when the nonvisible light 34 is radiated on the LED package 40.

FIG. 2C is a top view of the LED package 40 of FIG. 2B where the identification marker 12 is detectable with the detection device 44 when illuminated with nonvisible light 34 outside the visible spectrum. As such, the identification marker 12 of the LED package 40 remains undetectable without specific knowledge of how to detect it with the detection device 44. By way of example, the detection device 44 may include a camera or a sensor capable of detecting light from 100 nm to less than 400 nm. In other embodiments, the detection device 44 may include a camera or sensor capable of detecting light from above 700 nm to less than 2000 nm. In certain examples, when illuminated with nonvisible light 34 in a range from 100 nm to less than 400 nm, the nonvisible light 42 from the identification marker 12 is either in a range from 100 nm to less than 400 nm or from above 700 nm to less than 2000 nm. In other examples, when illuminated with nonvisible light 34 in a range from above 700 nm to less than 2000 nm, the nonvisible light 42 from the identification marker 12 may be in a range from above 700 nm to less than 2000 nm.

Figure 3A:
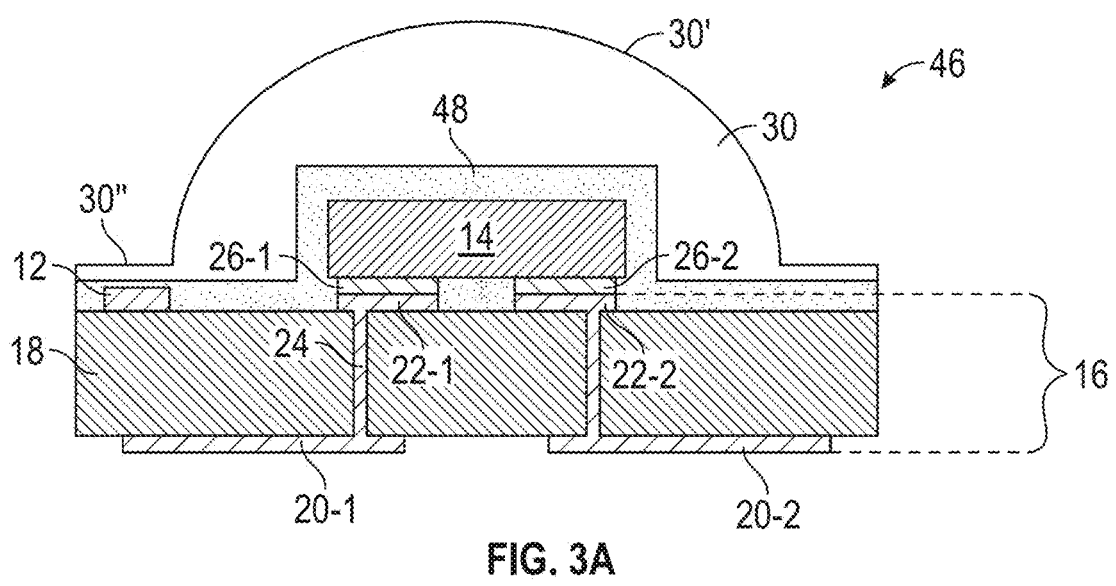
FIG. 3A is a cross-sectional view of the LED package similar to the LED package of FIG. 1A with a lumiphoric material according to principles of the present disclosure.
Figure 3B:
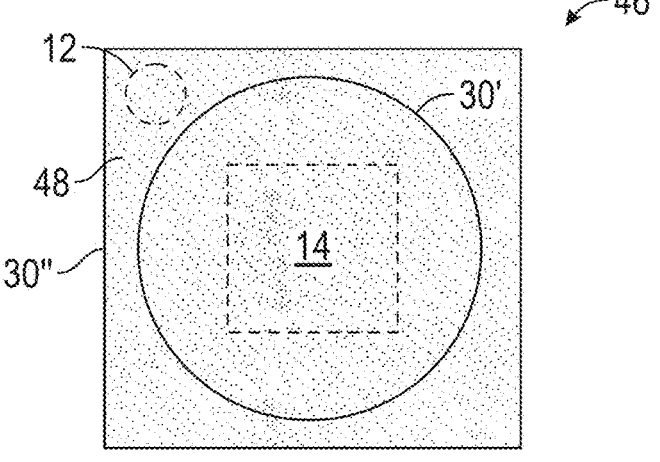
FIG. 3B is a top view of the LED package of FIG. 3A where the identification marker and the LED chip are covered by the lumiphoric material.
Figure 3C:
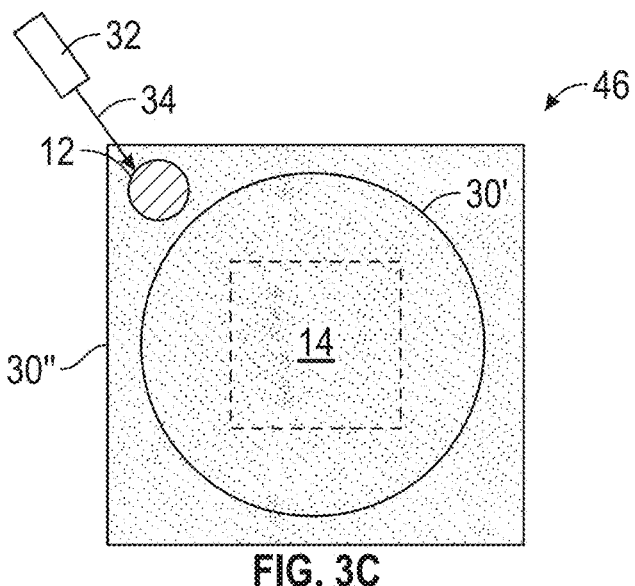
FIG. 3C is a top view of the LED package of FIG. 3B where the identification marker is detectable under the nonvisible light of the light source.

FIGS. 3A to 3C are various views of an LED package 46 similar to the LED package 10 of FIGS. 1A to 1C for embodiments that further include a lumiphoric material 48 on the LED chip 14 and the identification marker 12. The lumiphoric material 48 may cover and conceal the identification marker 12, even for embodiments when the identification marker 12 would otherwise be visible. In certain embodiments, the identification marker 12 of the LED package 46 may be configured to be visually undetectable as described above with respect to FIGS. 1A to 1C or FIGS. 2A to 2C. Alternatively, the identification marker 12 could include a material that is at least partially detectable by human vision but concealed by the lumiphoric material 48. Covering the identification marker 12 with the lumiphoric material 48 may provide further encapsulation and/or protection of the identification marker 12.

FIG. 3A is a cross-sectional view of the LED package 46 with the lumiphoric material 48 according to principles of the present disclosure. The LED package 46 may essentially be structured the same as the LED package 10 of FIGS. 1A to 1C, but where the LED package 46 provides a combination of light from the LED chip 14 and wavelength-converted light from the lumiphoric material 48 when electrically activated.

FIG. 3B is a top view of the LED package 46 of FIG. 3A where the identification marker 12 and the LED chip 14 are covered by the lumiphoric material 48. For illustrative purposes, the locations of the underlying identification marker 12 and the LED chip 14 are represented in dashed lines. The identification marker 12 remains undetectable under visible light, such as ambient light, light emitted by the LED chip 14, and light generated by the lumiphoric material 48.

FIG. 3C is a top view of the LED package 46 of FIG. 3B where the identification marker 12 is detectable under the nonvisible light 34 of the light source 32. In certain embodiments, the identification marker 12 is detectable by human vision under the nonvisible light 34 in a similar manner described above with respect to FIG. 1C. In other embodiments, the identification marker 12 is not detectable by human vision under the nonvisible light 34 and only detectable by way of the detection device described above with respect to FIG. 2C.

Figure 4:
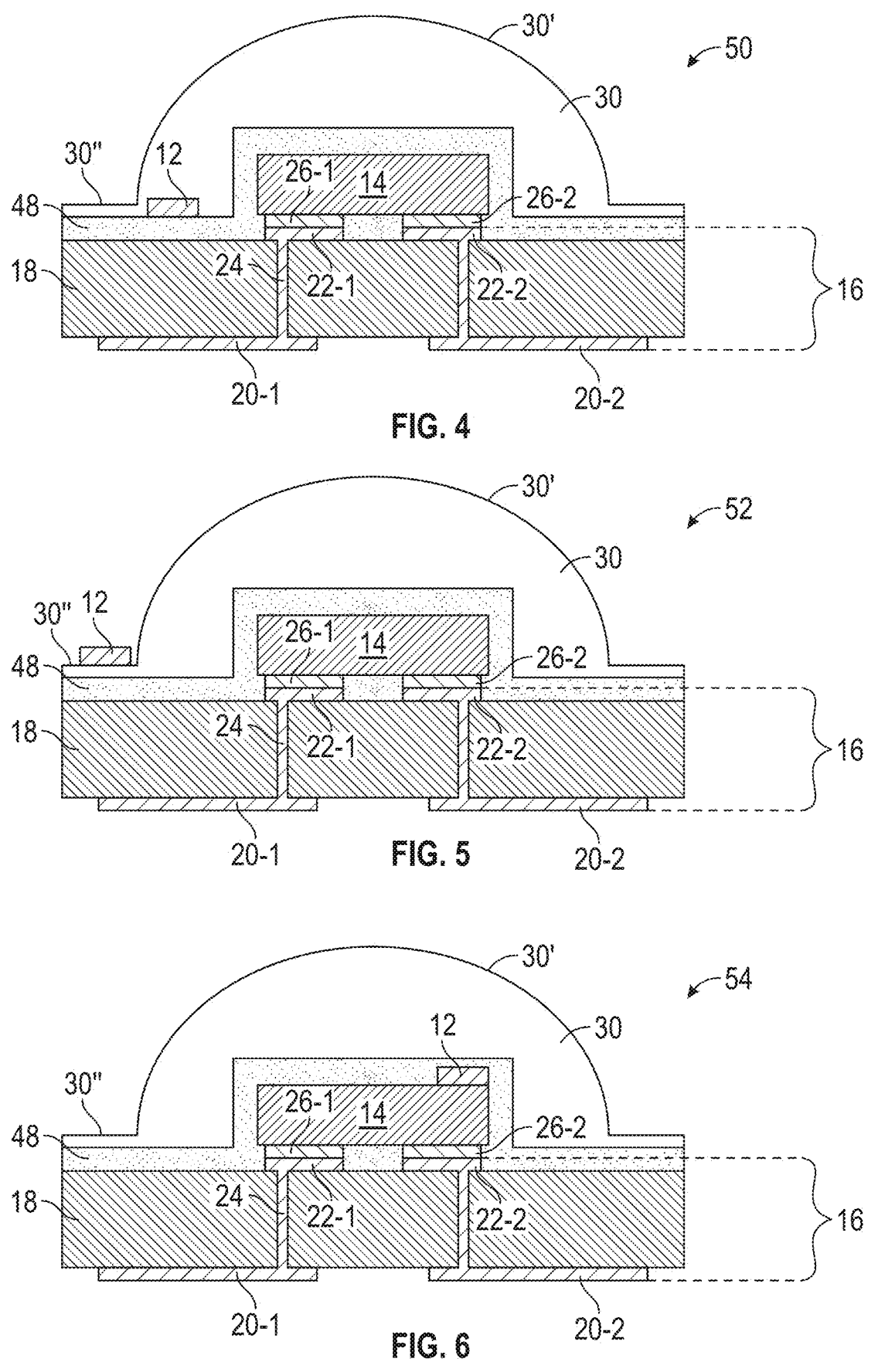

FIG. 4 is a cross-sectional view of an LED package 50 that is similar to the LED package 46 of FIGS. 3A to 3B with an alternative location of the identification marker 12 relative to the lumiphoric material 48. In the LED package 50, the identification marker 12 is positioned on the lumiphoric material 48 such that the lumiphoric material 48 is between the identification marker 12 and the submount 18. In certain embodiments, the identification marker 12 may further be arranged within a boundary of the lens 30'. In such embodiments, external nonvisible light (e.g., from the light source 32 of FIG. 3C) may reach the identification marker 12 without having to travel through the lumiphoric material 48.

FIG. 5 is a cross-sectional view of an LED package 52 that is similar to the LED package 46 of FIGS. 3A to 3B with another alternative location of the identification marker 12 relative to the lumiphoric material 48. In the LED package 52, the identification marker 12 is positioned above the lumiphoric material 48 such that the lumiphoric material 48 is between the identification marker 12 and the submount 18. In certain embodiments, the identification marker 12 may further be arranged on the encapsulant 30 such that at least a portion of the encapsulant 30 is between the identification marker 12 and the submount 18. For example, the identification marker 12 may reside on the extension 30" of the encapsulant 30. In such embodiments, external nonvisible light (e.g., from the light source 32 of FIG. 3C) may reach the identification marker 12 without having to travel through the lumiphoric material 48 and the encapsulant 30.

FIG. 6 is a cross-sectional view of an LED package 54 that is similar to the LED package 46 of FIGS. 3A to 3B with another alternative location of the identification marker 12 relative to the lumiphoric material 48. In the LED package 54, the identification marker 12 is positioned on the LED chip 14 and covered by the lumiphoric material 48. Such an arrangement may position the identification marker 12 higher above the submount 18 for receiving external nonvisible light (e.g., from the light source 32 of FIG. 3C). Since the identification marker 12 is transparent to visible light, the identification marker 12 should not have a substantial impact on emission from the LED chip 14.

Figure 7:
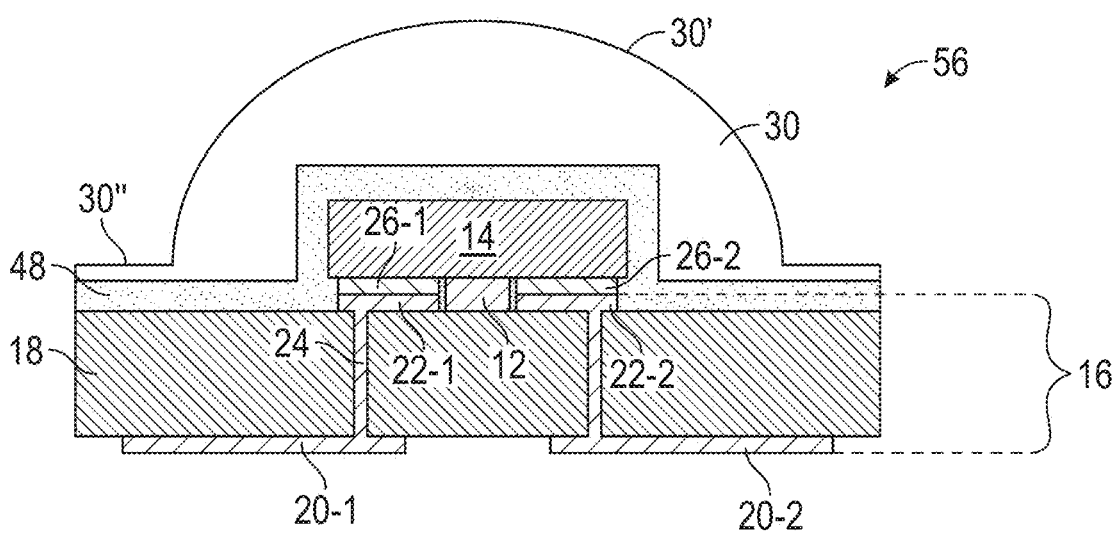
FIG. 7 is a cross-sectional view of an LED package that is similar to the LED package of FIGS. 3A to 3B for embodiments where the identification marker is hidden between the LED chip and the submount.

FIG. 7 is a cross-sectional view of an LED package 56 that is similar to the LED package 46 of FIGS. 3A to 3B for embodiments where the identification marker 12 is hidden between the LED chip 14 and the submount 18. In this arrangement, detection of the identification marker 12 may require removal of the at least one LED chip 14 so that nonvisible light (e.g., from the light source 32 of FIG. 3C) may reach the identification marker 12. Such an arrangement may be advantageous for further concealing the identification marker 12 so that it may not be readily copied in counterfeit products. In certain embodiments, the identification marker 12 is provided on a side of the LED chip 14 that is mounted to the submount 18, such as between the anode and cathode pads 26-1, 26-2 of the LED chip 14.

Figure 8:
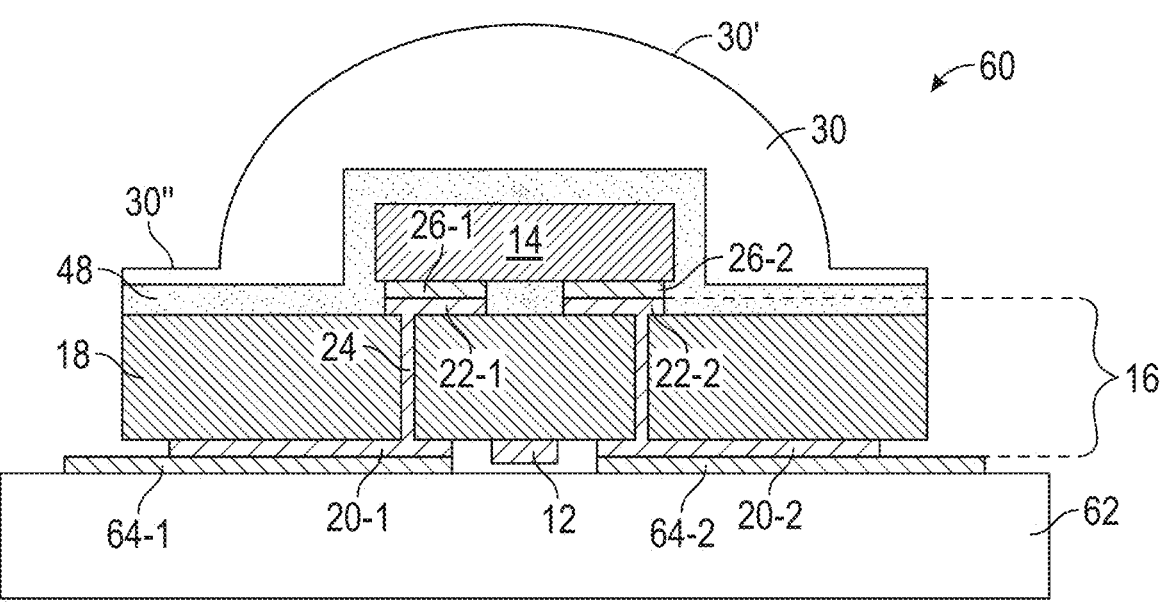
FIG. 8 is a cross-sectional view of an LED package that is similar to the LED package of FIG. 7 for embodiments where the identification marker is on a side of the support element opposite the LED chip.

FIG. 8 is a cross-sectional view of an LED package 60 that is similar to the LED package 56 of FIG. 7 for embodiments where the identification marker 12 is on a side of the support structure 16 opposite the LED chip 14. Accordingly, the identification marker 12 is hidden on a bottom side of the LED package 60. In certain embodiments, the identification marker 12 is between the package mounting pad 20-1 and the package mounting pad 20-2. FIG. 8 further illustrates the LED package 60 mounted to a board 62 of a larger LED device. The board 62 may embody a printed circuit board or the like of an LED module or an LED lighting device. The board may include electrically conductive traces 64-1, 64-2 for receiving the package mounting pads 20-1, 20-2. When the LED package 60 is mounted to the board 62, the identification marker 12 is effectively hidden. Accordingly, detection of the identification marker 12 may require removal of the LED package 60 from the board 62 so that nonvisible light (e.g., from the light source 32 of FIG. 3C) may reach the identification marker 12.

Figure 9:
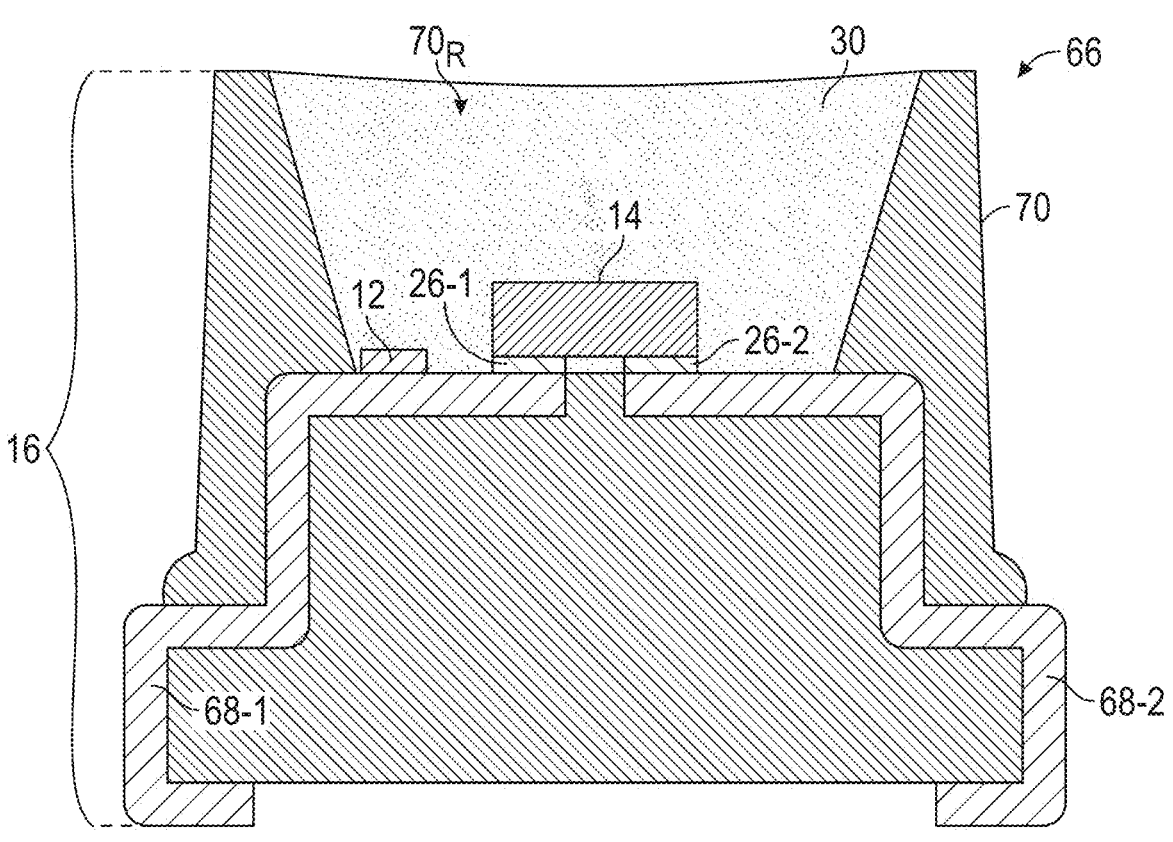
FIG. 9 is a cross-sectional view of an LED package that is similar to the LED package of FIGS. 3A to 3B for embodiments where the support structure is a lead frame structure.

FIG. 9 is a cross-sectional view of an LED package 66 that is similar to the LED package 46 of FIGS. 3A to 3B for embodiments where the support structure 16 is a lead frame structure. The support structure 16 of FIG. 9 includes leads 68-1, 68-2 electrically coupled to the anode and cathode pads 26-1, 26-2 of the LED chip 14 and a housing 70 about at least a portion of the leads 68-1, 68-2. The housing 70 forms a recess 70R in which the LED chip 14 resides. In certain embodiments, the identification marker 12 is positioned within the recess 70R and adjacent to the LED chip 14, and the encapsulant 30 may fill the recess 70R and cover the LED chip 14 and the identification marker 12.

The identification marker 12 of any of the previously described embodiments, including FIGS. 1A to 9, may be formed with a variety of shapes that convey information. Exemplary shapes include circles, squares, triangles, multiple identification markers 12, alphanumeric symbols, bar codes and quick-response codes. Varying the shape of the identification marker 12 may be used to identify specific product families, part numbers, manufacturers, and the like. FIGS. 10 to 13 are provided as examples of some of the various shapes for the any of the identification markers 12 of FIGS. 1A to 9 in addition to the circular shapes shown in FIGS. 1B, 1C, 3B, and 3C.

Figure 10:
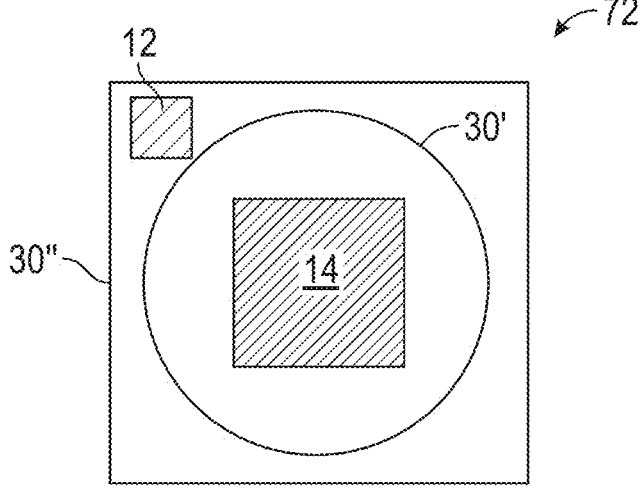
FIG. 10 is a top view of an LED package similar to the LED package of FIGS. 1A to 1C for embodiments where the identification marker is formed with a square shape.
Figure 11:
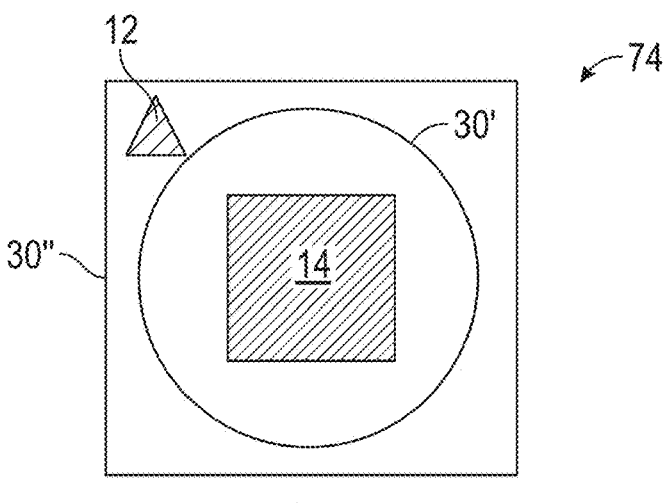
FIG. 11 is a top view of an LED package similar to the LED package of FIGS. 1A to 1C for embodiments where the identification marker is formed with a triangular shape.
Figure 12:
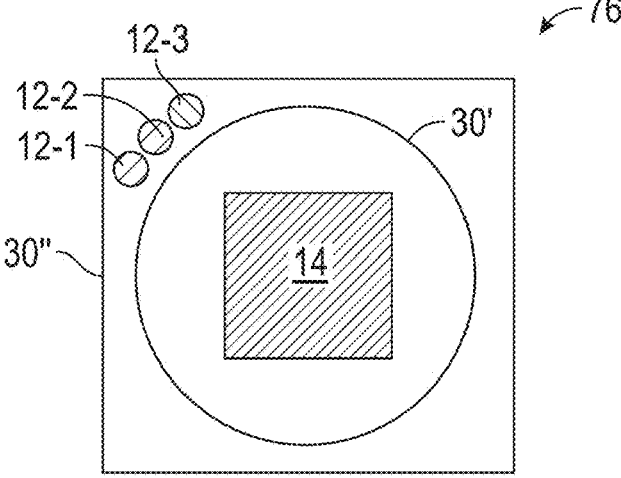
FIG. 12 is a top view of an LED package similar to the LED package of FIGS. 1A to 1C for embodiments where multiple identification markers are formed.
Figure 13:
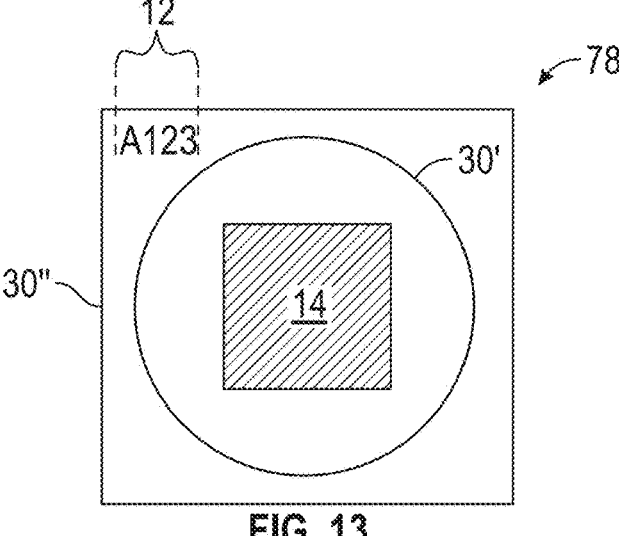
FIG. 13 is a top view of an LED package similar to the LED package of FIGS. 1A to 1C for embodiments where the identification marker is formed with alphanumeric characters.

FIG. 10 is a top view of an LED package 72 similar to the LED package 10 of FIGS. 1A to 1C for embodiments where the identification marker 12 is formed with a square shape. FIG. 11 is a top view of an LED package 74 similar to the LED package 10 of FIGS. 1A to 1C for embodiments where the identification marker 12 is formed with a triangular shape. FIG. 12 is a top view of an LED package 76 similar to the LED package 10 of FIGS. 1A to 1C for embodiments where multiple identification markers 12-1 to 12-3 are formed. Each of the identification markers 12-1 to 12-3 of FIG. 12 may provide a different wavelength of nonvisible light for detection in certain embodiments. In other embodiments, the identification markers 12-1 to 12-3 may collectively form a larger shape, such as a logo. FIG. 13 is a top view of an LED package 78 similar to the LED package 10 of FIGS. 1A to 1C for embodiments where the identification marker 12 is formed with alphanumeric characters.

Figure 14A:
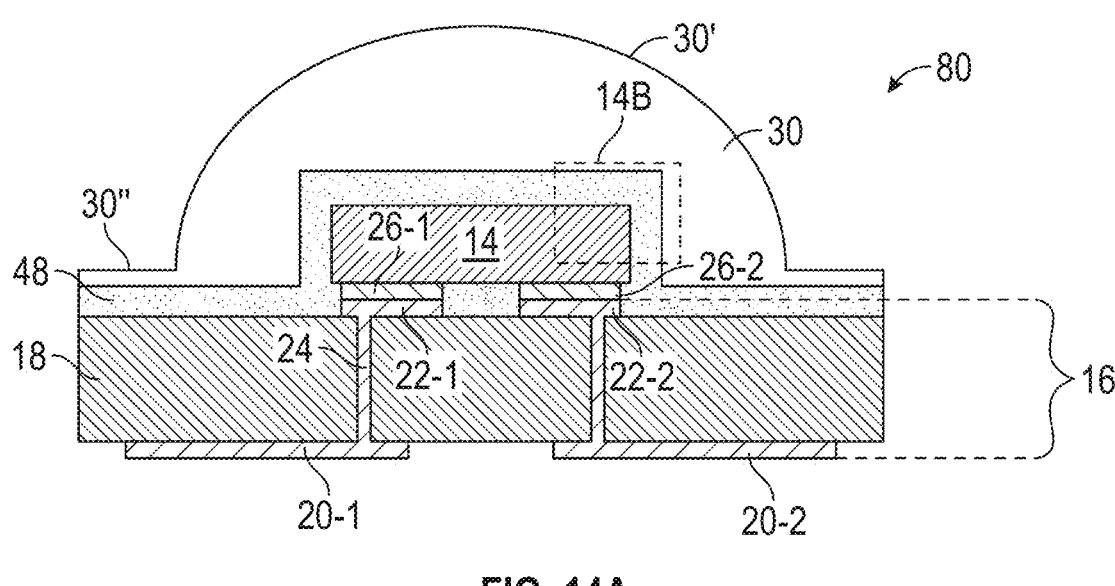
FIG. 14A is a cross-sectional view of an LED package that is similar to the LED package of FIGS. 3A to 3C for embodiments where identification marking capability is incorporated within the lumiphoric material.
Figure 14B:
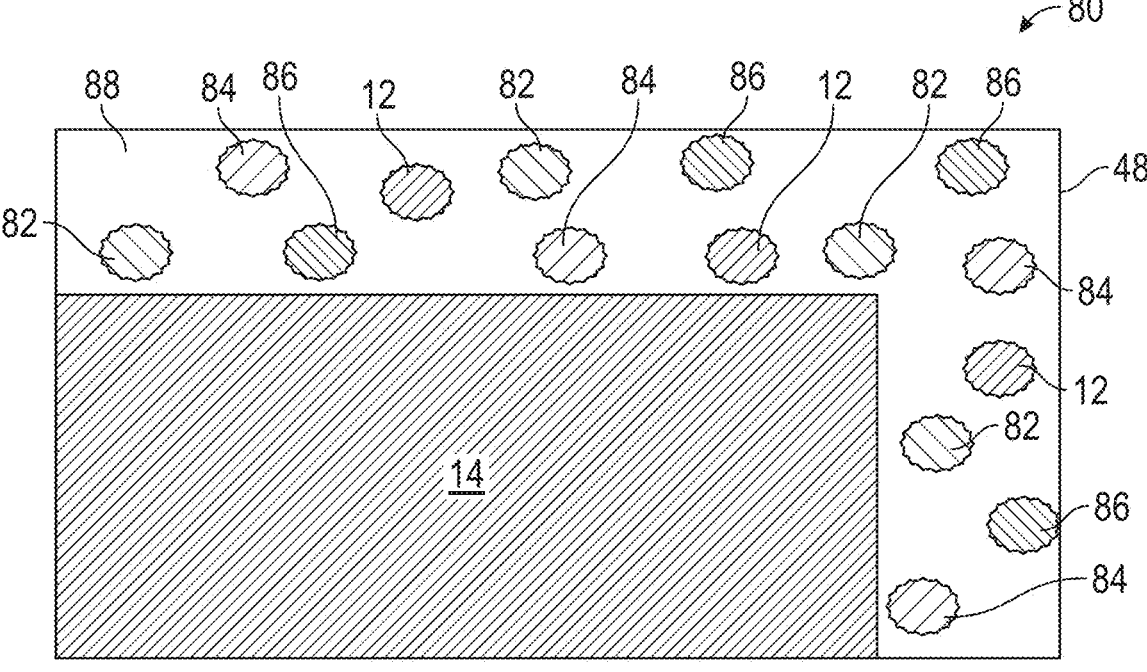
FIG. 14B is a cross-sectional view of a portion of the LED package as indicated by the superimposed dashed-line box labeled 14B of FIG. 14A.

FIG. 14A is a cross-sectional view of an LED package 80 that is similar to the LED package 46 of FIGS. 3A to 3C for embodiments where identification marking capability is incorporated within the lumiphoric material 48. FIG. 14B is a cross-sectional view of a portion of the LED package 80 as indicated by the superimposed dashed-line box labeled 14B of FIG. 14A. The view provided in FIG. 14B illustrates the identification marker 12 as a distribution of particles intermixed with other lumiphoric particles 82, 84, 86 within a binder 88 of the lumiphoric material 48. In certain embodiments, the binder 88 comprises silicone that is mixed with particles of the identification marker 12 and the other lumiphoric particles 82, 84, 86 and formed on the LED chip 14. The binder 88 may be cured to fix the particles of the identification marker 12 and the other lumiphoric particles 82, 84, 86 in place.

The lumiphoric particles 82, 84, 86 may comprise one or more combinations of different lumiphoric materials that provide different wavelength-converted light. For example, the LED chip 14 may be configured to provide visible light in a range from 400 nm to 700 nm with a specific example being blue light in a range from 430 nm to 480 nm. Each of the lumiphoric particles 82, 84, 86 may be configured with an excitation spectrum that provides wavelength-converted light, such as yellow, green, and/or red light, in response to receiving the blue light from the LED chip 14. The particles of the identification marker 12 may embody lumiphoric particles with excitation spectrums outside the visible spectrum such as from 400 nm to 700 nm. Accordingly, the particles of the identification marker 12 may not convert light from the LED chip 14 to other wavelengths. That is, under normal operation when the LED chip 14 is electrically activated, the particles of the identification marker 12 remain inactive. Moreover, the particles of the identification marker 12 may not be readily visible within the lumiphoric material 48 when the LED chip 14 is electrically deactivated. For activation of the particles of the identification marker 12, light that is outside the visible spectrum, such as from 100 nm to less than 400 nm or from above 700 nm to 2000 nm may be radiated on the LED package 80 in a manner as described above with respect to FIGS. 1C, 2C, and/or 3C.

Figure 14C:
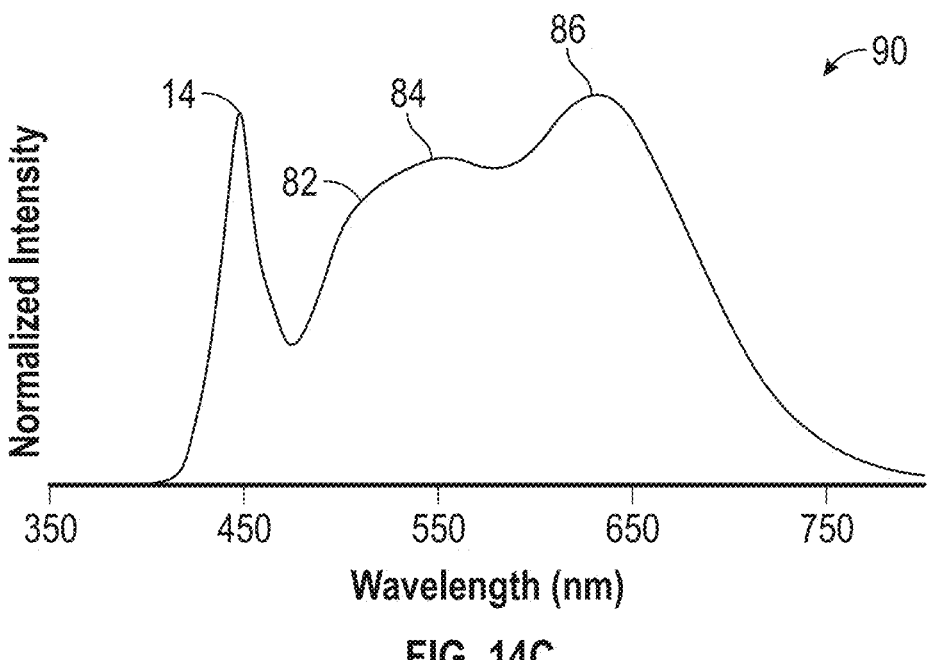
FIG. 14C is a plot representing an emission spectrum of the LED package of FIGS. 14A and 14B when the LED chip is electrically activated.

FIG. 14C is a plot representing an emission spectrum 90 of the LED package 80 of FIGS. 14A and 14B when the LED chip 14 is electrically activated. The x-axis represents wavelength in nm while the y-axis represents normalized emission intensity. As illustrated, the LED chip 14 produces a peak wavelength of about 450 nm, and the lumiphoric particles 82, 84, 86 collectively provide broad emission wavelengths above 450 nm up to about 700 nm.

Figure 14D:
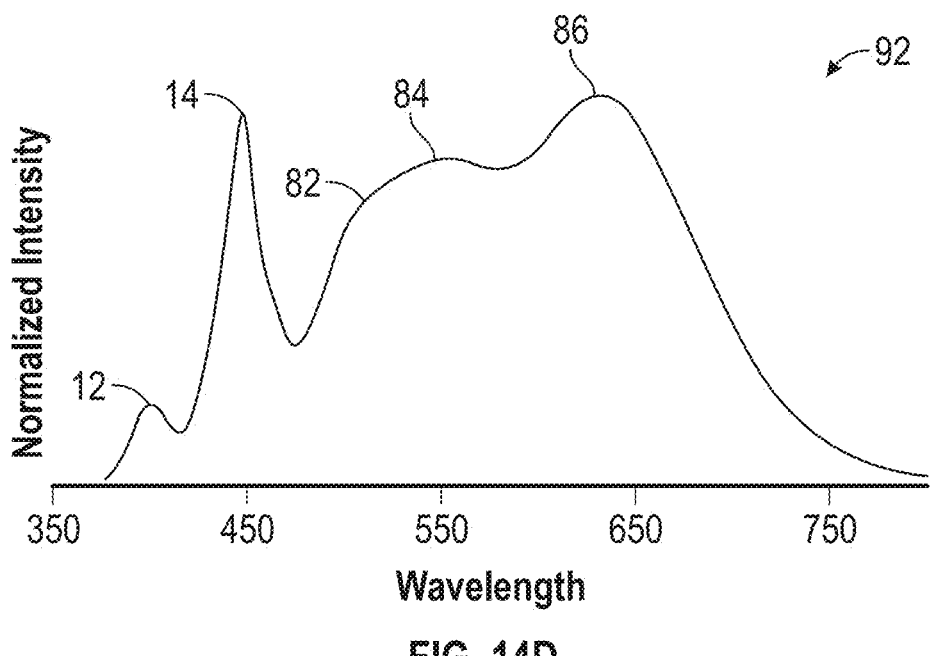
FIG. 14D is a plot representing an emission spectrum of the LED package of FIGS. 14A and 14B when the LED package is radiated with ultraviolet light from an external light source.

FIG. 14D is a plot representing an emission spectrum 92 of the LED package 80 of FIGS. 14A and 14B when the LED package 80 is radiated with ultraviolet light from an external light source. In this example, the particles of the identification marker 12 are configured to provide responsive emissions below about 400 nm, thereby providing a new peak in the emission spectrum 92. Accordingly, the emission spectrum 92 of FIG. 14D provides an effective marker that identifies the presence of the identification marker 12 embedded within the LED package 80 of FIGS. 14A and 14B. While ultraviolet emissions were selected for the embodiment of FIG. 14D, the principles are equally applicable for embodiments where the identification marker 12 provides a peak wavelength above 700 nm.

Figure 15:
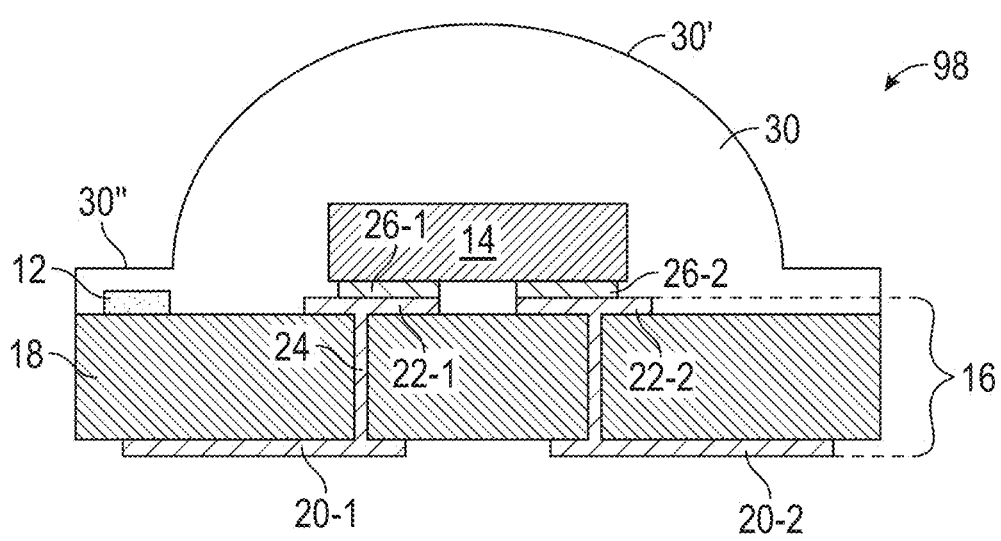
FIG. 15 is a cross-sectional view of an LED package that is similar to the LED package of FIG. 1A for embodiments where the identification marker comprises a material with a detectable structure.

FIG. 15 is a cross-sectional view of an LED package 98 that is similar to the LED package 10 of FIG. 1A for embodiments where the identification marker 12 comprises a material with a detectable structure. The identification marker 12 of FIG. 15 may remain transparent to visible light as previously described. However, in certain embodiments, the identification marker 12 may comprise a material that does not necessarily have to interact with nonvisible light for detection. Instead, the identification marker 12 may comprise a unique material that would not otherwise be present in conventional LED packages. For example, the unique material may comprise a polymeric material or an elemental material that is undetectable with visual inspection and/or radiation of light. The unique material would however be detectable by way of characterization equipment. In certain embodiments, the characterization embodies destructive characterization where portions of the LED package 98 are removed, such as de-capping the encapsulant 30 and/or cutting a cross-section through one or more portions of the LED package 98. In the example of polymeric material for the identification marker 12, such as polyethylene, detection may be performed by way of Fourier transform infrared (FTIR) spectroscopy or ramen spectroscopy. In the example of an elemental material for the identification marker 12, such as glass doped with the elemental material, detection of the particular element may be performed by way of secondary-ion mass spectrometry (SIMS), x-ray photoelectron spectroscopy (XPS), and/or energy-dispersive x-ray spectroscopy (EDS), among others.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein. For example, the lead frame structure described above with respect to FIG. 9 may be implemented as the support structure 16 for any of the other embodiments, including FIGS. 1A to 8, and 10 to 15.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:
   at least one LED chip configured to generate light in a first wavelength range from 400 nanometers (nm) to 700 nm;
   a support structure comprising electrical connections electrically coupled to the at least one LED chip;
   an identification marker on the support structure, the identification marker configured to be transparent to the light in the first wavelength range; and
   an encapsulant on the support structure, the encapsulant covering the at least one LED chip and the identification marker on the support structure.

2. The LED package of claim 1, wherein the identification marker is configured to be detectable under light in a second wavelength range that is outside the first wavelength range.

3. The LED package of claim 2, wherein the identification marker is configured to convert light in the second wavelength range to visible light in the first wavelength range.

4. The LED package of claim 2, wherein the identification marker is configured to absorb light in the second wavelength range and generate light in the second wavelength range that is detectable with a detection device capable of detecting light in the second wavelength range.

5. The LED package of claim 2, wherein the second wavelength range is from 100 nm to less than 400 nm or from above 700 nm to 2000 nm.

6. The LED package of claim 1, wherein the support structure comprises a submount on which the at least one LED chip is mounted, and the identification marker is on the submount and laterally spaced from the at least one LED chip.

7. The LED package of claim 6, wherein the encapsulant forms a lens over the at least one LED chip, and the identification marker is outside a boundary of the lens.

8. The LED package of claim 7, wherein the encapsulant forms an extension that laterally extends from the boundary of the lens to a peripheral edge of the submount, and the identification marker is covered by the extension.

9. The LED package of claim 1, further comprising a lumiphoric material on the at least one LED chip, the lumiphoric material configured to convert at least a portion of light from the at least one LED chip to another wavelength that is in the first wavelength range.

10. The LED package of claim 9, wherein the lumiphoric material is further arranged to cover the identification marker on the support structure.

11. The LED package of claim 9, wherein the lumiphoric material is between the identification marker and the support structure.

12. The LED package of claim 9, wherein the identification marker comprises a distribution of particles within the lumiphoric material.

13. The LED package of claim 1, wherein the identification marker is on the at least one LED chip.

14. The LED package of claim 1, wherein the identification marker is between the at least one LED chip and the support structure.

15. The LED package of claim 1, wherein the identification marker forms at least one of alphanumeric characters, a bar code, or a quick-response code.

16. The LED package of claim 1, wherein the identification marker comprises a unique material such that the remainder of the LED package is devoid of the unique material.

17. A method of identification for a light-emitting device, the method comprising:
   providing a light-emitting diode (LED) package comprising a support structure, at least one LED chip on the support structure and configured to emit light in a first wavelength range from 400 nanometers (nm) to 700 nm, an identification marker on the support structure and configured to be transparent to light in the first wavelength range, and an encapsulant on the support structure, the encapsulant covering the at least one LED chip and the identification marker on the support structure; and
   detecting the identification marker.

18. The method of claim 17, wherein detecting the identification marker comprises radiating the LED package with a light source, the light source providing light in a second wavelength range from 100 nm to less than 400 nm or from above 700 nm to 2000 nm.

19. The method of claim 17, wherein detecting the identification marker comprises destructive characterization of the LED package.

20. A light-emitting diode (LED) package comprising:
   a support structure;
   at least one LED chip on a first side of the support structure and electrically coupled to electrical connections, the at least one LED chip configured to generate light in a first wavelength range from 400 nanometers (nm) to 700 nm;
   an encapsulant on the support structure, the encapsulant covering the at least one LED chip on the first side of the support structure; and
   an identification marker on a second side of the support structure opposite the first side, the identification marker configured to be transparent to the light in the first wavelength range.

21. The LED package of claim 20, further comprising a first package mounting pad and a second package mounting pad on the second side of the support structure, wherein the identification marker is between the first package mounting pad and the second package mounting pad.

* * * * *